(12) United States Patent
Zhang et al.

(10) Patent No.: US 10,857,830 B2
(45) Date of Patent: Dec. 8, 2020

(54) SILK FIBROIN-BASED OPTICAL ANTI-COUNTERFEITING MARK AND PREPARATION METHOD THEREOF

(71) Applicant: NANTONG TEXTILE & SILK INDUSTRIAL TECHNOLOGY RESEARCH INSTITUTE, Nantong (CN)

(72) Inventors: Keqin Zhang, Nantong (CN); Qingsong Li, Nantong (CN); Yu Peng, Nantong (CN); Ning Qi, Nantong (CN); Xiaohua Zhang, Nantong (CN)

(73) Assignee: NANTONG TEXTILE & SILK INDUSTRIAL TECHNOLOGY RESEARCH INSTITUTE, Nantong (CN)

( * ) Notice: Subject to any disclaimer, the term of this patent is extended or adjusted under 35 U.S.C. 154(b) by 315 days.

(21) Appl. No.: 15/745,862

(22) PCT Filed: Jul. 25, 2016

(86) PCT No.: PCT/CN2016/091537
§ 371 (c)(1),
(2) Date: Jan. 18, 2018

(87) PCT Pub. No.: WO2018/014362
PCT Pub. Date: Jan. 25, 2018

(65) Prior Publication Data
US 2020/0079133 A1    Mar. 12, 2020

(30) Foreign Application Priority Data
Jul. 19, 2016 (CN) .................... 2016 1 05701967

(51) Int. Cl.
*B42D 25/36* (2014.01)
*C09D 189/00* (2006.01)
(Continued)

(52) U.S. Cl.
CPC .......... *B42D 25/36* (2014.10); *C09D 189/00* (2013.01); *C23C 14/14* (2013.01)

(58) Field of Classification Search
CPC ........ B42D 25/36; C09D 189/00; C23C 14/14
(Continued)

(56) References Cited

U.S. PATENT DOCUMENTS

2014/0093902 A1 * 4/2014 Omenetto .............. B82Y 10/00
435/29

FOREIGN PATENT DOCUMENTS

CN          2497379 Y      6/2002
CN        104464505 A      3/2015
(Continued)

OTHER PUBLICATIONS

Diao, Ying Ying et al.; Multiple Structural Coloring of Silk-Fibroin Photonic Crystals and Humidity-Responsive Color Sensing, Advanced Functional Materials, 2013, 23, pp. 5373-5380 (Nov. 20, 2013).

*Primary Examiner* — Justin V Lewis
(74) *Attorney, Agent, or Firm* — SZDC Law P.C.

(57) ABSTRACT

The invention provides a silk fibroin-based anti-counterfeiting mark comprising a silk fibroin film layer and a gold film layer located on the silk fibroin film layer, and the area of the gold film layer is less than that of the silk fibroin film layer. The inventive also provides a method for preparing the silk fibroin-based optical anti-counterfeiting mark, the method comprises preparing an aqueous silk fibroin solution, coating the aqueous silk fibroin solution onto a substrate to obtain a silk fibroin film, and sputtering a layer of gold film on the silk fibroin film with a mask to obtain the silk fibroin-based optical anti-counterfeiting mark. In the invention a thin layer of Au film is sputtered on a silk fibroin film such that an anti-counterfeiting mark pattern appears at a
(Continued)

high humidity, the method is simple and can significantly the production cost of optical anti-counterfeiting mark.

2 Claims, 1 Drawing Sheet

(51) Int. Cl.
*C23C 14/14* (2006.01)
*B42D 25/373* (2014.01)
*C23C 14/20* (2006.01)
*C23C 14/04* (2006.01)
*C08L 89/00* (2006.01)
*B41M 3/14* (2006.01)

(58) Field of Classification Search
USPC ............ 283/67, 70, 72, 74, 94, 98, 901, 904
See application file for complete search history.

(56) References Cited

FOREIGN PATENT DOCUMENTS

| | | |
|---|---|---|
| CN | 104672733 A | 6/2015 |
| CN | 204955592 U | 1/2016 |
| WO | 2015114649 A1 | 8/2015 |

* cited by examiner

SILK FIBROIN-BASED OPTICAL ANTI-COUNTERFEITING MARK AND PREPARATION METHOD THEREOF

This application is a national stage application of PCT/CN2016/091537, filed on Jul. 25, 2016, which claims the priority to Chinese Patent Application No. 2016105701967, filed on Jul. 19, 2016, all of which are incorporated herein by reference in their entirety.

FIELD OF THE INVENTION

The present invention relates to the field of anti-counterfeiting marks, and more particularly to a silk fibroin-based optical anti-counterfeiting mark and the same.

DESCRIPTION OF THE RELATED ART

The anti-counterfeiting mark has important practical applications and is closely related to our lives in many aspects including banknotes, passports, tamper evident labels, securities, stamps, and identity cards or the like. Anti-counterfeiting marks can effectively repress forgeries, greatly increase difficulties and costs of forgeries, or decrease the simulation degree of forgeries, and thus ensure the safety and reliability of source file information.

Currently there are many kinds of anti-counterfeiting technologies and such technologies can be, according to disciplines, divided into physical anti-counterfeiting, chemical anti-counterfeiting, biological anti-counterfeiting, multi-disciplinary anti-counterfeiting, and applied technology-based anti-counterfeiting, etc. Physics-based optical anti-counterfeiting is particularly widely applied due to its characteristics of easy identification and discrimination, for example, optically variable ink, it manifests different colors when viewed from different angles (CN 202967210U); fluorescent ink, it emits fluorescence under the irradiation of ultraviolet or other lights of specific wavelengths (CN 103525179A); and holographic anti-counterfeiting, an optical pattern is formed by diffraction of light through concavo-convex microstructures (CN 101472746). In addition, some people have also studied the application of structural-colored photonic crystals in anti-counterfeiting marks (Chemistry of Materials, 2013, 25(13): 2684-2690), where $SiO_2$ nanospheres are arranged in a pattern of ordered photonic crystal structures, and a light curable resin ETPTA is then injected into the gaps for UV curing, finally a coating with a certain color and having good mechanical properties is formed. A structural-colored coating with a specific color can be obtained by controlling the size of $SiO_2$ nanospheres, this is very suitable for making an optical anti-counterfeiting mark pattern.

The current methods for producing an optical anti-counterfeiting pattern still have certain difficulties and high costs, especially for the anti-counterfeiting materials based on the structural color of photonic crystals, there exists the following disadvantages: the required materials have high costs, and particularly, $SiO_2$ nanospheres of various sizes have high costs and high prices because the production method is difficult and complicated, and thus are limited in applications; fine control is required for assembly of $SiO_2$ nanospheres, filling and curing of photosensitive resin ETPTA, etc. and any operational errors will lead to the complete failure of the whole process. These all result in the difficulties in producing such an optical anti-counterfeiting mark pattern, thus greatly limiting the practical applications thereof.

SUMMARY OF THE INVENTION

In order to solve the above technical problems, the object of the present invention is to provide a silk fibroin-based optical anti-counterfeiting mark and a method for preparing the same. A thin layer of gold (Au) film is sputtered on the surface of a silk fibroin film, and an anti-counterfeiting marking pattern appears at a high humidity. The preparation method is simple and can significantly reduce costs.

For the above purpose, the invention employs the following technical solutions.

In an aspect, the invention provides a silk fibroin-based optical anti-counterfeiting mark, the anti-counterfeiting mark comprises a silk fibroin film layer and a gold film layer located on the silk fibroin film layer, and the area of the gold film layer is less than that of the silk fibroin film layer.

Preferably, the gold film layer has an anti-counterfeiting pattern.

Preferably, the gold film layer has a thickness of 1-5 nm.

Preferably, the silk fibroin film layer has a thickness of 100-500 nm.

Preferably, the response humidity of the silk fibroin-based optical anti-counterfeiting mark is 65-100%.

In another aspect, the present invention also provides a method for preparing the silk fibroin-based optical anti-counterfeiting mark, comprising the following steps:

(1) preparing a silk fibroin aqueous solution;
(2) coating the silk fibroin aqueous solution onto a substrate to obtain a silk fibroin film after drying; and
(3) sputtering a layer of gold film on the silk fibroin film obtained in step (2) with a mask to obtain the silk fibroin-based optical anti-counterfeiting mark.

Preferably, in step (1), the mass concentration of the silk fibroin aqueous solution is 4-20%.

More preferably, the silk fibroin aqueous solution is prepared as follows:

silkworm cocoons are crushed and added into a basic solution for degumming, and then cleaned with water, and dried after the degumming is completed. The degummed silk is then immersed in a lithium bromide solution, and dialyzed and centrifuged to obtain the silk fibroin aqueous solution.

Preferably, in the step (2), the substrate is a silicon wafer. The color of the film spin-coated on the silicon wafer is clear due to the high flatness and good light reflection of the silicon wafer.

Preferably, in the step (2), the coating is performed by using the spin-coating method.

Preferably, in the step (2), the spin-coating rate is 1500-5000 rpm.

Preferably, in the step (2), the silk fibroin film has a thickness of 100-500 nm.

Preferably, in the step (3), the gold film is sputtered by using an ion sputter equipment.

More preferably, the sputtering conditions are as follows: the sputtering current is 10 mA, the sputtering time is 5-30 s, and the sputtering speed is 10 nm/min.

Preferably, in the step (3), the gold film layer has an anti-counterfeiting pattern.

More preferably, the anti-counterfeiting pattern is a triangle, a letter logo icon or any of other arbitrary shapes.

Preferably, in the method the response humidity of the silk fibroin-based optical anti-counterfeiting mark is 65-100%.

By means of the above technical solutions, as compared with the prior art, the invention has the following advantages:

In the invention, an anti-counterfeiting mark is produced by a spin-coating method in combination with an ion sputtering method. A film with a submicron-scale thickness is formed by spin-coating silk fibroin on a substrate, and such a film shows a certain color due to the interference effect and the color changes with the thickness of the film. A thin layer of Au pattern is sputtered on a specific area of the silk fibroin film with a mask, and though such a thin Au layer is not visible at a low humidity, it effectively weakens the contact between a part of silk fibroin and water molecules. Because silk fibroin is sensitive to humidity and undergoes certain expansion at a higher humidity, the part of silk fibroin not covered with the Au layer will expand at a high humidity due to moisture absorption and the color change occurs accordingly, while the color of the area covered with the Au layer changes in a small range, and this causes that the hidden pattern is revealed finally. The present invention also provides a simple method for preparing a silk fibroin-based optical anti-counterfeiting mark, this method can significantly reduce costs and is suitable for producing a new anti-counterfeiting identification pattern.

DESCRIPTION OF THE PREFERRED EMBODIMENTS

The invention will be further illustrated in more detail with reference to accompanying drawings. It is noted that, the following embodiments only are intended for purposes of illustration and are not intended to limit the scope of the invention.

In the embodiments of the invention, the silk fibroin aqueous solution was prepared as follows:

silkworm cocoons were cut into pieces of about 1 cm$^2$ and added into a boiled NaHCO$_3$ solution of 0.5 wt %. After boiling for 45 mins, the degummed silk was washed with deionized water 4 to 5 times. A picric acid-carmine solution was used for detection until the silk was completely degummed. After the degumming was completed, the silk fibroin was placed in an oven at 40° C. for drying. An amount of the degummed silk was weighed and fully immersed in a container containing a 10 M LiBr solution at a liquor ratio of 1:10, then the container was maintained at a constant temperature of 60° C. for one hour. Subsequently, the solution was dialyzed in a dialysis bag with a molecular weight cut-off of 7000 for 3 days, and then centrifuged at 9000 r/min for 20 min to obtain the aqueous silk fibroin solution, finally the obtained aqueous silk fibroin solution was placed in a refrigerator at 4° C. for storage.

Embodiment 1

1 ml of silk fibroin solution with a concentration of 7.5 wt % was spin-coated on a silicon wafer of 2 cm by 2 cm using a spin coater at a spin-coating rate of 3000 rpm, and then naturally dried at 25° C. to obtain a silk fibroin film with the orange color. An Au film layer with a thickness of about 2 nm was then sputtered on the surface of the silk fibroin film using a mask with a shape of triangle by an ion sputter equipment E-1045 to obtain a silk fibroin-based optical anti-counterfeiting mark, the sputtering current was 10 mA, the sputtering time was 10 s, and the sputtering speed was 10 nm/min. Finally, a triangular pattern was clearly revealed at a humidity above 65%.

Figure 1:
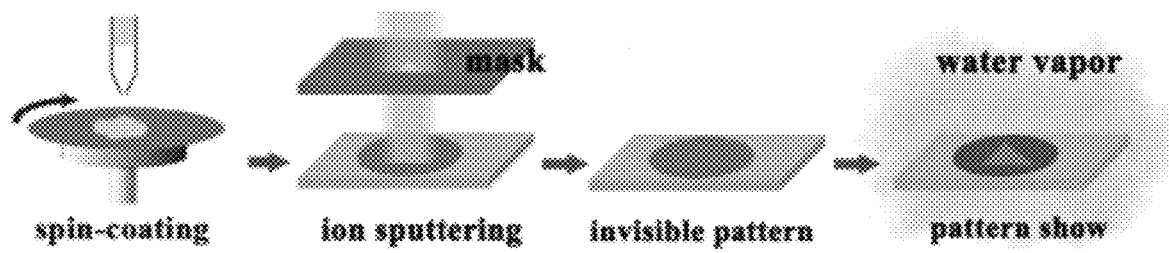
FIG. 1 is a schematic view showing the process of preparing an anti-counterfeiting mark according to the present invention.
Figure 2:
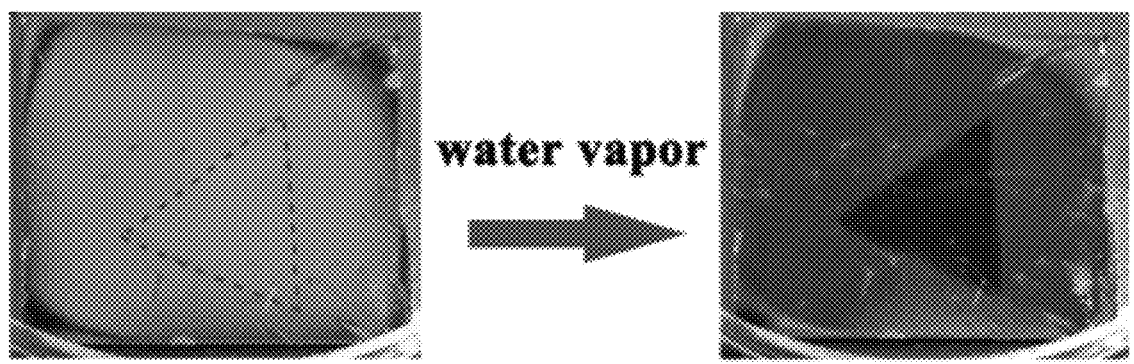
FIG. 2 shows an optical photograph of a silk fibroin film at a low and high humidity according to the invention, wherein a layer of triangular Au pattern is sputtered on the silk fibroin film.

FIG. 2 is an optical photograph of the silk fibroin film having an triangular Au film obtained in the embodiment 1 of the present invention at a humidity of 20% and 90%. The size is 2 cm by 2 cm, and it can be seen from the FIG. 1 that during the increase of humidity from 20% to 90%, the color in the pattern-free area changes from orange to light blue, and the color in the area with a triangular pattern changes from orange to blue.

Embodiment 2

1 ml of silk fibroin solution with a concentration of 10 wt % was spin-coated on a silicon wafer of 2 cm by 2 cm using a spin coater at a spin-coating rate of 3500 rpm, and then naturally dried at 25° C. to obtain a silk fibroin film with the yellow color. An Au film layer with a thickness of 2.5 nm was then sputtered on the surface of the fibroin film using a mask with a complicated logo shape by an ion sputter equipment E-1045 to obtain a silk fibroin-based optical anti-counterfeiting mark, the sputtering current was 10 mA, the sputtering time was 15 s, and the sputtering speed was 10 nm/min. Finally, a logo pattern was clearly revealed at a humidity of 85%.

Figure 3:
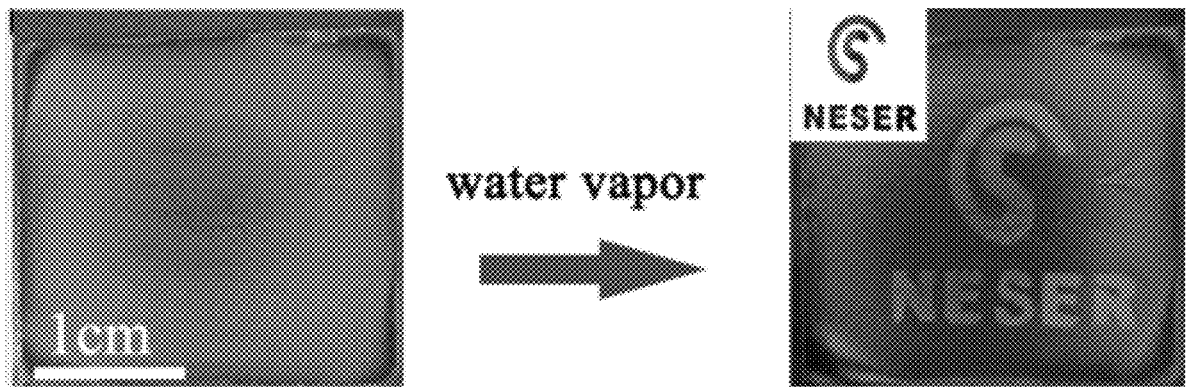
FIG. 3 shows an optical photograph of a fibroin film at a low and high humidity according to the invention, wherein a layer of complicated Au pattern is sputtered on the silk fibroin film.

FIG. 3 is an optical photograph of the fibroin film having an Au film with a complicated logo shape obtained in the embodiment 2 of the invention at a humidity of 30% and 85%. The size is 2 cm by 2 cm, and it can be seen from the FIG. 3 that during the increase of humidity from 30% to 85%, the color in the pattern-free area changes from yellow to blue and the color in the area with a logo pattern substantially remains yellow.

Embodiment 3

1 ml of fibroin solution with a concentration of 20 wt % was spin-coated on a silicon wafer of 2 cm by 2 cm using a spin coater at a spin-coating rate of 4000 rpm, and then naturally dried at 25° C. to obtain a silk fibroin film with the purple color. An Au film layer with a thickness of 5 nm was then sputtered on the surface of the silk fibroin film using a mask with a shape of square by an ion sputter equipment E-1045 to obtain a silk fibroin-based optical anti-counterfeiting mark, the sputtering current was 10 mA, the sputtering time was 30 s, and the sputtering speed was 10 nm/min. Finally, a square pattern was clearly revealed at a humidity above 65%.

The above preferred embodiments are described for illustration only, and are not intended to limit the scope of the invention. It should be understood, for a person skilled in the art, that various improvements or variations can be made therein without departing from the spirit and scope of the invention, and these improvements or variations should be covered within the protecting scope of the invention.

What is claimed is:

1. A method of preparing a silk fibroin-based optical anti-counterfeiting mark comprising steps of:
   (1) preparing an aqueous silk fibroin solution;
   (2) coating the aqueous silk fibroin solution onto a substrate to obtain a silk fibroin film; and (3) sputtering a layer of gold film on the silk fibroin film obtained in step (2) with a mask to obtain the silk fibroin-based optical anti-counterfeiting mark, wherein the silk fibroin film layer has a thickness of 100-500 nm; the gold film layer has a thickness of 1-5 nm; and a humidity at which a pattern of the silk fibroin-based optical anti-counterfeiting mark is revealed is 65%-85%, and wherein in the step (2), the substrate is a silicon wafer.

2. The method as claimed in claim 1, wherein in the step (1), a mass concentration of the aqueous silk fibroin solution is 4-20%.

\* \* \* \* \*